(12) United States Patent
Pornin et al.

(10) Patent No.: US 8,962,069 B2
(45) Date of Patent: Feb. 24, 2015

(54) PROCESS FOR MAKING A STRUCTURE WITH HERMETICALLY CLOSED CAVITY UNDER CONTROLLED ATMOSPHERE

(75) Inventors: Jean-Louis Pornin, Crolles (FR); Xavier Baillin, Crolles (FR); Charlotte Gillot, Aix-les-Bains (FR); Laurent Vandroux, Le Cheylas (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 74 days.

(21) Appl. No.: 13/605,019

(22) Filed: Sep. 6, 2012

(65) Prior Publication Data
US 2013/0243942 A1    Sep. 19, 2013

(30) Foreign Application Priority Data
Sep. 8, 2011 (FR) ...................................... 11 57975

(51) Int. Cl.
  B05D 5/12       (2006.01)
  B29C 41/20      (2006.01)
  B81C 1/00       (2006.01)
  H01L 23/053     (2006.01)
  H01L 23/31      (2006.01)

(52) U.S. Cl.
  CPC ............. *B29C 41/20* (2013.01); *B81C 1/00285* (2013.01); *H01L 23/053* (2013.01); *H01L 23/315* (2013.01); *B81C 2203/0136* (2013.01); *B81C 2203/0145* (2013.01); *H01L 2924/0002* (2013.01)
  USPC ....... 427/96.2; 427/96.3; 427/96.4; 427/96.5; 427/96.6

(58) Field of Classification Search
  USPC ................................................ 427/96.2–96.6
  See application file for complete search history.

(56) References Cited

U.S. PATENT DOCUMENTS

| 7,803,665 B2 * | 9/2010 | Witvrouw et al. | ............ 438/124 |
| 2003/0183916 A1 | 10/2003 | Heck et al. | |
| 2004/0245586 A1 * | 12/2004 | Partridge et al. | ............ 257/414 |

(Continued)

FOREIGN PATENT DOCUMENTS

| DE | 10 2007 022 509 A1 | 11/2008 |
| EP | 0 846 941 A1 | 6/1998 |

(Continued)

OTHER PUBLICATIONS

French Preliminary Search Report issued Apr. 18, 2012 in Patent Application No. FR 1157975 (with English translation of Categories).

*Primary Examiner* — Brian K Talbot
(74) *Attorney, Agent, or Firm* — Oblon, Spivak, McClelland, Maier & Neustadt, L.L.P.

(57) ABSTRACT

A process for making an encapsulation structure comprising the following steps: 1) make at least one portion of material capable of releasing at least one gas when said material is heated, the portion of material communicating with the inside of a hermetically closed cavity of the encapsulation structure, 2) heat all or part of said portion of material such that at least part of the gas is released from said portion of material in the cavity, and in which said portion of material capable of releasing at least one gas when said material is heated comprises elements trapped in said portion of material, said trapped elements being released from said portion of material in gaseous form when said material is heated.

15 Claims, 4 Drawing Sheets

(56) References Cited

U.S. PATENT DOCUMENTS

| | | |
|---|---|---|
| 2007/0273013 A1 | 11/2007 | Kohl et al. |
| 2008/0049386 A1* | 2/2008 | Pornin et al. .................. 361/679 |
| 2008/0164542 A1* | 7/2008 | Yang et al. .................... 257/415 |
| 2008/0296747 A1* | 12/2008 | Feyh ............................. 257/682 |
| 2010/0003789 A1* | 1/2010 | Caplet et al. ................. 438/124 |
| 2010/0307786 A1 | 12/2010 | Kohl et al. |
| 2011/0048129 A1 | 3/2011 | Yamanaka et al. |

FOREIGN PATENT DOCUMENTS

| | | |
|---|---|---|
| WO | WO 2005/089348 A2 | 9/2005 |
| WO | WO 2005/089348 A3 | 9/2005 |

\* cited by examiner

PROCESS FOR MAKING A STRUCTURE WITH HERMETICALLY CLOSED CAVITY UNDER CONTROLLED ATMOSPHERE

TECHNICAL FIELD

The invention relates to a process for making an encapsulation structure comprising a hermetically closed cavity with a controlled atmosphere. The invention is advantageously applicable to encapsulate electronic devices such as MEMS (micro-electromechanical system), MOEMS (micro opto-electromechanical system) or NEMS (nano electromechanical system) type devices, for example switches, that operate in environments in which the pressure is between about one or a few hundred mbars (up to about 1 bar), for example to dampen vibrations in devices, or passive components such as variable or adjustable capacitors.

STATE OF PRIOR ART

It is known that an electronic device, for example of the MEMS type, can be encapsulated in a cavity by making the electronic device on a first substrate and then solidarising a second substrate to the first substrate through a bonding interface. The device is then encapsulated in the cavity that is delimited by two substrates forming the upper and lower walls of the cavity and by the bonding interface that forms the side walls of the cavity.

It is also known that electronic devices can be encapsulated by thin layers with TLP (Thin Layer Packaging), particularly in order to reduce the size of the encapsulation structure. A TLP type encapsulation consists firstly of making the electronic device on a substrate and then covering the electronic device with a sacrificial layer shaped according to the shape of the required cavity. This sacrificial layer is then covered by a thin layer that will form a cover. Release holes are then made through the cover, thus forming accesses so that the sacrificial layer can be etched. Release holes are then closed off. The result obtained is a cavity inside which the electronic device is encapsulated.

In order to operate correctly, some electronic devices for example such a switch type MEMS devices, must be placed in controlled gaseous atmospheres in which pressures are between about 100 mbars and about 1 bar. This atmosphere is capable particularly of damping vibrations of these devices and therefore maintaining correct operation of them.

In the case of a TLP type encapsulation, the release holes may be closed off by making a PVD (Physical Vapour Deposition) type deposition of a plugging material. The pressure obtained in the cavity corresponds to the ambient pressure in the deposition chamber when the cavity is closed. However, the pressures that can be obtained by closing the cavity in this way are usually a few mbars, and are not sufficient to assure that these devices work correctly.

The cavity can also be closed off by a PECVD (Plasma Enhanced Chemical Vapour Deposition) type deposition of the plugging material. Once again, the pressures that can be obtained are too low (a few tens of mbars at the best). Furthermore, closing the cavity in this way often generates residues of precursor gases in the cavity, and these residues may hinder correct operation of the device.

The cavity can also be closed by making a polymer deposition plugging the release holes. But in this case, the presence of organic compounds at the release holes may hinder operation of the electronic device. Hermeticity of the cavity thus closed is usually poor.

To obtain pressures of the order of a few hundreds of mbars, document EP 0 846 941 A1 discloses a process for implantation of a gaseous phase through a membrane forming the cover of a cavity. This gas implantation is made after the cavity has been closed.

Although this process can obtain the required gaseous phase at the required pressure within the cavity, the energies necessary to get the gaseous phase to pass through the membrane and the closing layers are very high. Some electronic devices may also be sensitive to this gas implantation. It is then difficult to protect these devices during such a gas implantation.

PRESENTATION OF THE INVENTION

Thus there is a need to propose a process of making an encapsulation structure with a hermetically closed cavity so as to obtain a pressure within the cavity for example equal to about or more than 100 mbars, which is compatible with a TLP type encapsulation without the need for gas implantation in the cavity after it has been closed.

To achieve this, one embodiment discloses a process for making an encapsulation structure comprising at least the following steps:
  make at least one portion of material capable of releasing at least one gas when said material is heated, the portion of material communicating with the inside of a hermetically closed cavity of the encapsulation structure,
  heat all or part of said portion of material such that at least part of the gas is released from said portion of material in the cavity.

Said portion of material capable of releasing at least one gas when said material is heated comprises elements trapped in said portion of material, said trapped elements being released from said portion of material in gaseous form when said material is heated.

Therefore, the process consists of forming a material deposition in the cavity or at a location in liaison with the inside of the cavity, before or while it is hermetically closed, for example in the form of one or more layers and/or portions capable of releasing at least one gas and then releasing said gas after the cavity has been hermetically closed, by heating said material.

Therefore, such a process can release at least one gas after the cavity has been hermetically closed, this gas increasing the pressure in the cavity, so that a final pressure can be obtained in the hermetically closed cavity that is greater than the pressure in the cavity when it was closed, without the need for a gas implantation in the cavity after it has been closed. Furthermore, this process can be used to check the quantity of gas released into the cavity making use of heating parameters and/or the gas quantity that can be potentially released from the material, and therefore to precisely control the final pressure obtained within the hermetically closed cavity. Furthermore with this process, the nature of the gas released in the cavity and therefore the type of gaseous atmosphere in the cavity after it has been closed can also be controlled.

The volume of the portion(s) of material formed in the cavity can be chosen depending on the required pressure within the cavity, which correspondingly modifies the volume of the cavity and therefore the volume of gas to be released to obtain the required pressure. The portion(s) of material may be sized depending on the quantity of gas to be released in the cavity.

Furthermore, unlike gases originating from the decomposition of materials, for example organic materials, the nature of the trapped elements in the material, in other words the enclosed or stored elements, may be chosen without being limited by the nature of the material that will release the gas. Gases originating from the decomposition of an organic material are organic gases that can be aggressive or disturbing for elements present in the encapsulation structure, and particularly electrical contacts. With this process, the portion of material from which the gas(es) is (are) released is not decomposed, because this or these gases originate(s) from elements trapped in the material and not from the material itself. Released gases may advantageously be inorganic.

Trapped elements may be implanted doping agents and/or chemical elements for example derived from processes for making said portion of material or steps carried out in the presence of said portion of material, these processes or steps possibly being used so as to optimise the volume of these elements trapped in the material and therefore to optimise the volume of gas that can be released into the material. Trapped chemical elements may be elements derived from plasma gas used when making said portion (for example nitrogen and/or hydrogen present during an electrolytic deposition, and/or argon present during etching, etc.). Trapped elements may advantageously be inorganic.

Finally, this process is compatible with a TLP type encapsulation and also with an encapsulation by substrate transfer.

The portion of material which is made communicates with the inside of the closed cavity, which means that a fluid can circulate from the portion of material to the inside of the cavity.

The process may also comprise a step to make at least one electronic device in the cavity before the cavity is hermetically closed. Such a process can control the nature of the gas(es) that will be released in the cavity, this or these gases may be chosen from among inactive gases that have no influence on the performances or operation of the electronic device.

The term "electronic device" refers to any type of electronic and/or electrical device, and the dimensions of which may be measured in micrometers (microelectronic device) or nanometers (nanoelectronic device) or even millimeters.

The process may also comprise the following steps before application of the heating step of said portion of material:
  make the electronic device and said portion of material on a substrate,
  make the hermetically closed cavity in which at least the electronic device and said portion of material may be placed, the cavity possibly being formed between the substrate and a cover.

The electronic device may be made on the substrate before or after said portion of material.

In this case, the process may also comprise production of at least one layer of material capable of releasing at least one gas when said material is heated, arranged in the cavity and in contact with the cover or forming the cover, during the making of the hermetically closed cavity, the heating step possibly also heating said layer of material and capable of releasing at least part of the gas from said material layer in the cavity.

The material layer capable of releasing gas may be continuous or non-continuous and it may comprise one or several patterns of said material.

Furthermore, said material made in the form of a layer or one or several portions, may be composed of a stack of one or several materials depending on the nature and the volume of the gas(es) to be released in the cavity. When there is a material capable of releasing gas on the substrate and a material capable of releasing gas in contact with the cover (or forming the cover), these materials may be or may not be of the same nature.

The process may also comprise the following steps before the heating step is applied to said portion of material:
  make the electronic device on a substrate,
  make the hermetically closed cavity in which at least the electronic device may be located, the cavity possibly being formed between the substrate and a cover, said portion of material possibly forming a layer of material arranged in the cavity and in contact with the cover.

Production of the cavity may include production of at least one hole through at least the cover such that the hole may form an access inside the cavity, the cavity then possibly being hermetically closed by plugging the hole with at least one second portion of the material capable of releasing at least one gas when said material is heated, the heating step possibly also heating said second portion of material, releasing at least part of the gas from said second portion of material in the cavity.

Production of the cavity may include the production of at least one hole through at least the cover such that the hole may form an access inside the cavity, the cavity possibly then being hermetically closed by plugging the hole with at least one layer of material capable of releasing at least one gas when said material is heated and covering the cover, the heating step possibly also heating said material layer, releasing at least part of the gas from said layer of material in the cavity.

The process may also comprise the following steps before the step to make said portion of material:
  make the electronic device on a substrate,
  make the cavity in which at least the electronic device may be placed, the cavity possibly being formed between the substrate and a cover,
  wherein the production of the cavity may include the production of at least one hole through at least the cover, the cavity then possibly being hermetically closed by making said portion of material such that it may plug the hole.

The process may also comprise the following steps, before the step to make said portion of material:
  make the electronic device on a substrate,
  make the cavity inside which at least the electronic device is placed, the cavity being formed between the substrate and a cover,
  wherein the production of the cavity possibly including the production of at least one hole through at least the cover, the cavity then being hermetically closed by making said portion of material in the form of a layer covering the cover.

At least said portion of material may be made by at least one PVD or CVD (for example PECVD or HDP-CVD) type deposition of said material, said deposition then possibly storing gaseous elements in said material.

Said material capable of releasing at least one gas when said material is heated may comprise implanted doping agents, said doping agents possibly being released in gaseous form when said material is heated.

Therefore, the released gas may correspond to gaseous elements stored during the PVD or CVD type deposition or doping agents released in gaseous form during heating. The released gas may also correspond to gaseous elements stored during the PVD or CVD type deposition and doping agents released in gaseous form during heating, which can release several types of gases.

The cavity may be hermetically closed under a vacuum or at low pressure of at least one gas. Thus, the final pressure and the nature of the gas(es) inside the hermetically closed cavity are fully dependent (if the cavity is closed under a vacuum) or partially dependent (if the cavity is closed under a gas pressure) of the gas(es) released when the material is heated. The presence of air or moisture or precursor gases in the cavity can thus be avoided when the cavity is closed.

Said material capable of releasing at least one gas when said material is heated may be composed of at least one metal, heating of said portion of material possibly being done at a temperature greater than or equal to the melting point of said material, or at a temperature below the melting point of said material.

Unlike metals usually used in microelectronics that are covered by an insulation, the material capable of releasing at least one gas may be a metal deposited on an insulation.

The production of said portion of material capable of releasing at least one gas when said material is heated may comprise a first PVD or PECVD type deposition of a first metal and a second deposition by electrolysis or degraded electrolysis of a second metal on the first metal.

BRIEF DESCRIPTION OF THE DRAWINGS

This invention will be better understood after reading the description of example embodiments given purely for guidance and that are in no way limitative with reference to the appended drawings in which:

FIGS. 4 to 7 show encapsulation structures obtained by the use of processes for making encapsulation structures according to different embodiments and variants of these embodiments.

Identical, similar or equivalent parts in the different figures described below have the same numeric references to facilitate comparison between the different figures.

The different parts shown in the figures are not necessarily all at the same scale, to make the figures more easily readable.

The different possibilities (variants and embodiments) shall be understood to be not mutually exclusive, they may be combined with each other.

DETAILED PRESENTATION OF PARTICULAR EMBODIMENTS

Refer firstly to FIGS. 1A to 1E that show the steps in a process for making an encapsulation structure 100 according to a first embodiment, comprising a cavity 102 inside which an electronic device 104 will be encapsulated.

Figure 1A:
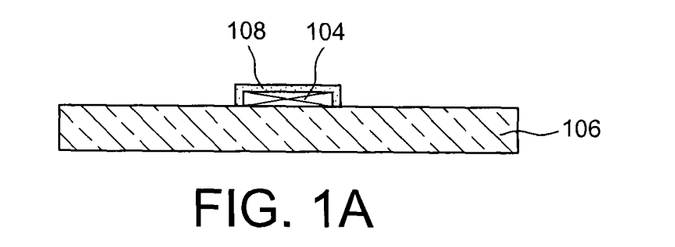
FIGS. 1A to 1E show the steps in a process for making an encapsulation structure according to a first embodiment.

As shown in FIG. 1A, an electronic device 104, for example a MEMS type device, is made on a substrate 106 composed for example of silicon. The electronic device 104 in this case is a MEMS switch that will operate under a controlled atmosphere and pressure. The electronic device 104 is formed from several elements comprising fixed parts and moving parts. When the device 104 is made, the moving parts are held in position by a sacrificial material 108, for example composed of polymer and/or polycrystalline silicon that can be etched selectively relative to other materials that will be present in the cavity 102, shown diagrammatically in FIG. 1A in the form of a layer covering the device 104.

Figure 1B:
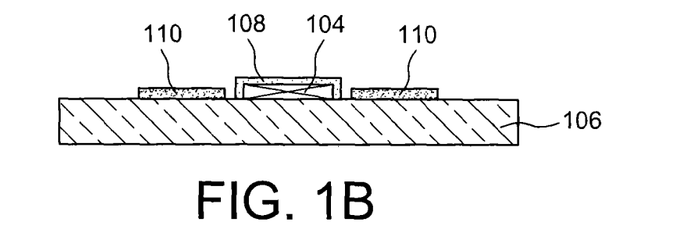

Portions 110 of material containing gaseous elements are then made on the substrate 106, around the electronic device 104 (FIG. 1B). This is done by firstly depositing a layer of material inside which the gaseous elements are stored, covering the substrate 106 and the electronic device 104 (and therefore the sacrificial material 108). This layer is then shaped, for example by photolithography and etching, in order to keep portions 110 of this material containing gaseous elements on the substrate 106, around the electronic device 104. These portions of material 110 are located on surfaces of the substrate 106 that will be encapsulated in the future cavity 102. The portions 110 may be made so that they occupy the largest possible surface area on the substrate 106.

The material of the portions 110 inside which the gas is enclosed may for example be a dielectric material such $SiO_2$ or SiN. The presence of gas in this material is obtained by means of the deposition process used. Thus, when the portions 110 are made by PVD deposition of the material, the gases present in the deposition chamber are trapped in the deposited material due to the pressure existing in the deposition chamber. Therefore, depending on the nature of the gas (es) present in the deposition chamber, the deposited material may contain one or several types of gaseous elements depending on the nature of the gaseous atmosphere required in the future cavity 102, and for example may be argon and/or hydrogen and/or nitrogen.

The pressure and the nature of the gas(es) present in the deposition chamber are chosen for example as a function of the nature and quantity of gas to be trapped or enclosed in the material of the portions 110.

In one variant, gas may be trapped in the material of portions 110 by making a PECVD deposition of this material. A PECVD deposition makes it possible to trap a larger quantity of gaseous species in the deposited material than a PVD deposition. However, such a PECVD deposition also traps more complex gaseous species and precursor gases in the material.

In another variant, other types of deposition processes or steps may be carried out to store chemical elements in the material of the portions 110.

Figure 1C:
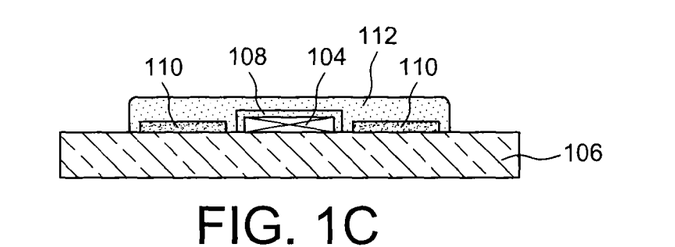

The next step is encapsulation of the electronic device 104 and portions of material 110 by a thin layer. Thus, as can be seen in FIG. 1C, a layer of sacrificial material 112, for example composed of polymer and/or polycrystalline silicon, and for example similar in nature to the sacrificial material 108 is then deposited on the substrate 106, covering the electronic device 104 (and therefore the sacrificial material 108) and portions 110 of the material containing the gaseous species. This layer of sacrificial material 112 is shaped such that the remaining volume of this layer 112 corresponds to the required volume of the future cavity 102. For example, the layer 112 may be between about 1 µm and 10 µm thick depending on the required height of the future cavity 102. The sacrificial material is chosen such that it can be etched selectively with respect to the other materials that will be kept in the future cavity 102, in other words the material(s) of the substrate 106, the electronic device 104, the portions 110 and the future cover.

A conforming deposition of a material is then made to form a layer that will form the cover 114 of the cavity 102 in which the device 104 and the portions of material 110 will be encapsulated. The cover 114 thus covers the sacrificial layer 112. This cover 114 may for example be composed of a dielectric material such as $SiO_2$ or SiN, but it may also be composed of a semiconducting material such as silicon or even a conducting material such as a metallic material. The thickness of the cover 114 may for example be between about 0.1 µm and 5 µm.

Figure 1D:
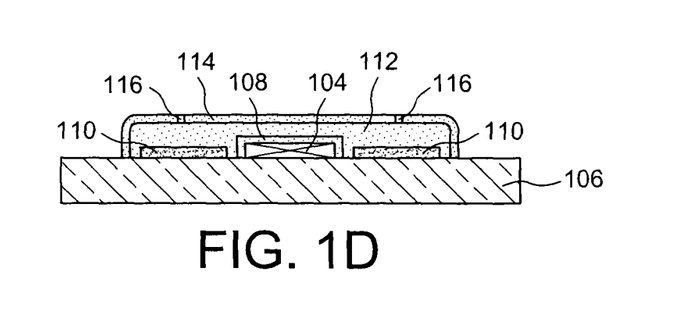

The next step is to make one or several release holes 116 through the cover 114, forming accesses to the sacrificial layer 112 (see FIG. 1D in which two holes 116 are shown).

The sacrificial layer 112 and the sacrificial material 108 are then etched through the release holes 116 by one or several chemical etching agents adapted to the nature of the materials to be etched, thus forming the cavity 102 delimited by the substrate 106 and the cover 114 and in which the electronic device 104 and the portions 110 of material containing gaseous species are encapsulated.

Figure 1E:
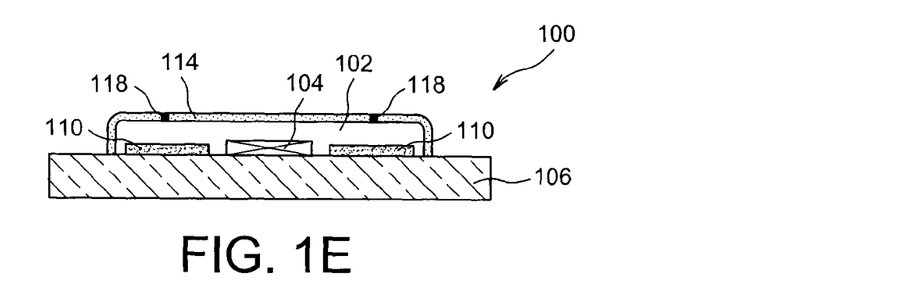

The release holes 116 are then closed off, or plugged, by a plugging material 118, for example corresponding to a dielectric or metallic material, closing off the release holes 116 and hermetically closing the cavity 102 (FIG. 1E).

The cavity 102 is advantageously closed in an environment under a vacuum or at low pressure with one or several gases that do not hinder operation of the electronic device 104, in order particularly to prevent the presence of air, moisture and/or precursor gases that might hinder operation of the electronic device 104 inside the hermetically closed cavity 102.

A heating cycle is then applied to the encapsulation structure 100 to heat the portions 110, such that the gaseous species stored in the portions of material 110 escape from the portions 110 and are released into the cavity 102. Heating of portions 110 continues until the pressure in the cavity 102 reaches the operating pressure required for the electronic device 104, for example between about 100 mbars and 1 bar. The quantity of gas released that is correlated to the pressure in the cavity 102 may be adjusted by varying parameters of the temperature cycle applied to the encapsulation structure 100, and particularly the heating time and the temperature to which the portions of material 110 are exposed.

The encapsulation structure 100 may for example be heated to a temperature of between about 100° C. and 400° C., which makes this process compatible with the presence of CMOS devices on the substrate 106. However, if there are no elements in the encapsulation structure that limit the heating temperature, this temperature may be higher than 400° C. The heating time of the encapsulation structure 100 may for example be between a few minutes and a few hours.

In this first embodiment, the portions of material 110 containing the gaseous species are made after making the electronic device 104, which avoids the loss of any gaseous species or contamination of portions of material 110 by other gases that could occur if these portions 110 were made on the substrate 106 before the electronic device 104 and if they were exposed to steps of making the electronic device 104 (steps that may require a large thermal budget).

However, if possible depending on the steps carried out to make the electronic device 104, in other words if these steps do not degrade the material containing gaseous species, it is possible that the portions of material 110 should be made on the substrate 106 before the electronic device 104. In another variant, it is also possible that the portions of material 110 should be derived from one or several layers of material used to form parts of the electronic device 104.

In the previously described example, the portions 110 of material containing the gaseous species are heated by applying a temperature cycle to the entire encapsulation structure 100. As a variant, the portion(s) 110 of material containing gas may be heated locally, for example by means of light excitation of the portions 110 by laser through the cover 114.

Figure 2:
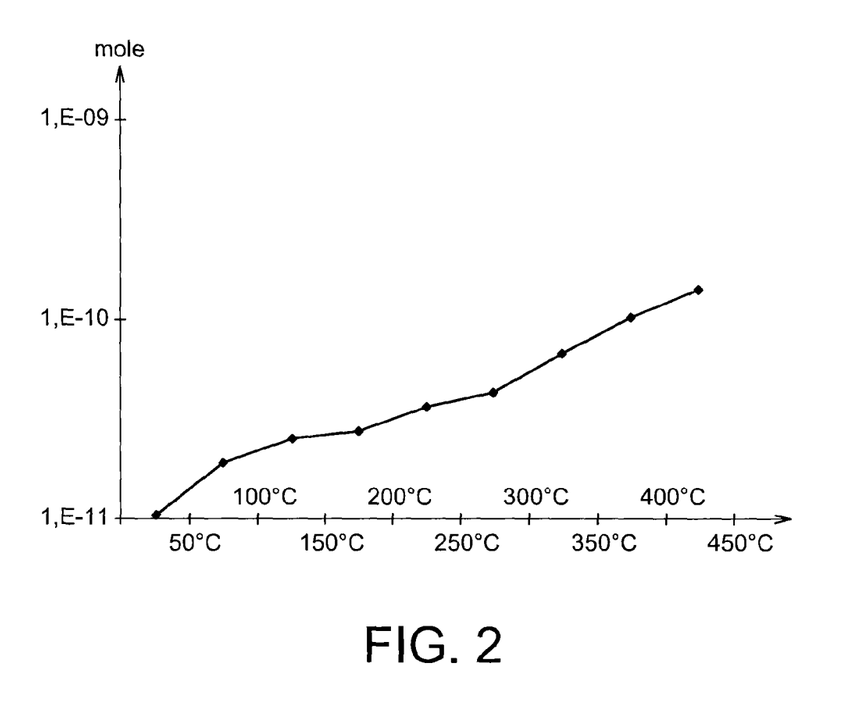
FIG. 2 shows a quantity of gas released in moles per mm$^2$ of a material containing gas species as a function of the temperature during a heating step performed during a process for making an encapsulation structure.

The quantity of gas trapped in the material from which the portions 110 are made can be adapted depending on the required nature and pressure of gas in the cavity 102, the applicable temperature cycle and the achievable degassing efficiency of the portions 110. The quantity of gas desorbed by a layer of material of the type in portions 110 may be characterised as follows:

A sample of a known surface material in which the gas is trapped is enclosed under a vacuum, for example in an envelope. The sample of material is heated and then cooled so as to release the trapped gaseous species. The pressure in the envelope is then measured, for example using a friction vacuum meter type device, in order to calculate the quantity of desorbed molecules. FIG. 2 shows the accumulated number of gas moles released per mm$^2$ of material, in this case tungsten, containing gas species as a function of the annealing temperature.

The formula PV=nRT can be used to calculate the pressure equivalent to this number of moles released in a cavity with a volume equal to $5\times10^{-3}$ mm$^3$. For example, for a quantity of $10^{-10}$ moles obtained with a heating cycle at a temperature equal to about 400° C., the pressure obtained is equal to:

$$P=10^{-10}\times 0.082\times 300/5\times 10^{-9}=0.5 \text{ atm}$$

where
n=$10^{-10}$ moles;
R=0.082 l·atm·K$^{-1}$·mole$^{-1}$;
T=300 K;
V=$5\times10^{-9}$ l.

Figure 3:
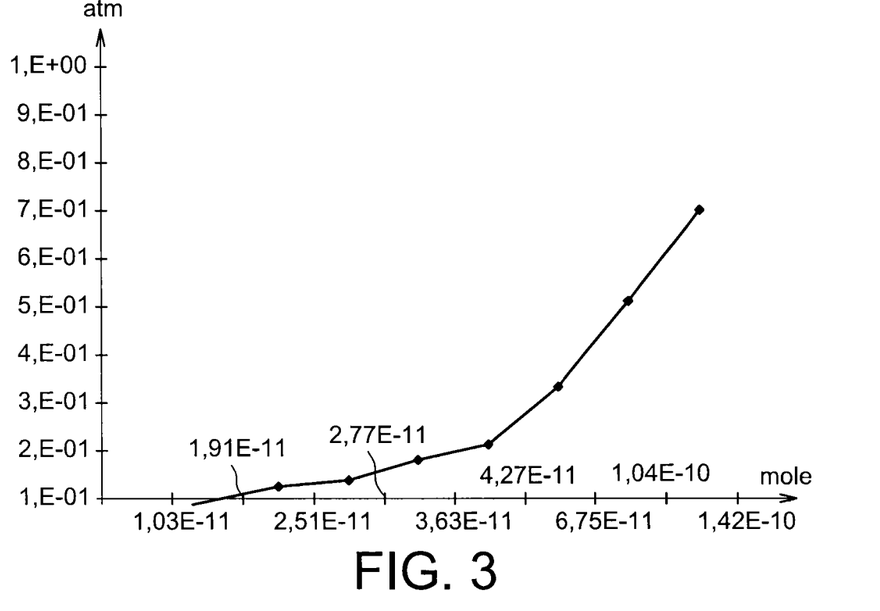
FIG. 3 shows a pressure obtained in a cavity of an encapsulation structure made according to a process as a function of the number of moles of gas inside it.

FIG. 3 shows the pressure obtained in this cavity as a function of the number of moles of gas inside it. For the material characterised in this example, it can be seen that a pressure equal to about 0.7 atm can be obtained with an appropriate temperature cycle.

Thus, the pressure that can be obtained in the cavity will depend on the characteristics of the thermal cycle applied, the gas dose trapped or implanted in the material, the surface area of the material containing the gaseous species and the volume of the cavity.

In another variant, the portions 110 may be composed of a metal, for example indium, or a metal alloy such as AuSn. In the previously described example, gaseous species are trapped in these metallic portions during deposition of these portions, for example by PVD or PECVD. Such a PVD deposition is made using plasma composed of a gas or mixture of gases not soluble in the metal. For example, a PVD deposition of aluminium can be made with argon or krypton plasma, or a gold deposition can be made with argon, krypton or nitrogen plasma or a mix of these gases.

The portions 110 may also be composed of a eutectic alloy that will make degassing possible at a temperature compatible with the electronic components.

Thus, a first metallic layer can be deposited, for example composed of gold or nickel, by PVD in the presence of argon, krypton or nitrogen or a mix of these gases and then a layer of another metal, for example tin, can be deposited by electrolysis. In the case of a deposition of gold by PVD followed by a deposition of tin by electrolysis, respecting proportions corresponding to the 80/20 AuSn eutectic by mass, a heat treatment can melt this alloy at about 280° C. and therefore the gas(es) trapped in gold will be released at this temperature. According to another example, the first metal (for example gold) can be deposited using the same PVD process, but the second metal (in this case tin) can be deposited using a degraded electrolysis process leading to H$_2$ gas molecules being trapped in the tin. This degraded electrolysis is done by increasing current densities during the electrolysis, thus increasing the metal deposition rate compared with a conventional electrolysis, which will cause hydrogen molecules to be trapped in the material deposited by electrolysis. The heat treatment with re-melting can release a mix of ArH$_2$ type gases with reducing properties that may be conducive to improving the reliability of the electronic device 104, for example preventing oxidation of metallic parts such as electrical contacts of the device.

After having hermetically closed the cavity 102, these metallic portions 110 are exposed (locally or generally) to a temperature higher than the melting point of the metal or the metal alloy of the portions 110, thus causing its melting and degassing in the cavity 102 of the gaseous species stored in these portions 110. In particular, this variant has the advantage that all the gas trapped in the portions 110 is released quickly.

In another variant, the portions 110 may be composed of a metal/oxide bilayer. The portions 110 may for example be formed by an aluminium layer deposited on a $SiO_2$ layer obtained by an HDP (High Density Plasma, for example HDP-CVD) type deposition and shaped by a dry etching process. In this case, the aluminium layer and the $SiO_2$ layer are in liaison with the cavity 102 (there is no material and particularly no passivation material, on the portions 110).

In the previously described example, gas is released from the portions 110 into the cavity 102 due to the fact that the material of the portions 110 contains gaseous species during the PVD or PECVD deposition of these portions 110. In one variant, the gas released in the cavity may originate from doping agents implanted in the portions 110, these doping agents being released in gaseous form when the portions 110 are heated. Thus, it is possible to make portions 110 using production techniques other than a PVD or PECVD type deposition. Furthermore, when the substrate 106 comprises the device 104, for example a MEMS type device and CMOS devices, the steps or implantation equipment used for doping the CMOS devices may be used for doping the portions 110.

Released gases may originate both from gaseous species stored in the portions 110 during deposition of these portions, and also doping agents implanted in the portions 110.

Figure 4:
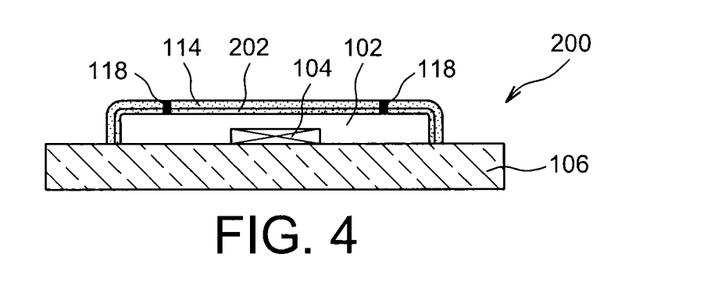

FIG. 4 shows an encapsulation structure 200 obtained by the use of a production process according to a second embodiment.

Compared with the previously described encapsulation structure 100, the encapsulation structure 200 does not comprise any portions of material 110 on the substrate 106 from which gaseous species escape. In this second embodiment, the gaseous species are stored in a layer of material 202 partly or entirely (as is the case in the example in FIG. 4) covering the walls (top and side walls) of the cover 114 located inside the cavity 102.

For example, such an encapsulation structure 200 can be obtained by firstly making the electronic device 104 on the substrate 106 and then the sacrificial layer 112. A layer 202 of material containing gaseous elements, for example with a nature similar to the material of portions 110, is then deposited in a conforming manner (with an approximately constant thickness), for example by PVD or PECVD deposition, such that it covers the sacrificial layer 112. The process is then completed in a manner similar to that used to make the encapsulation structure 100, in other words making the cover 114 and the release holes 116 (that also pass through the layer 202) and then etching the sacrificial layer 112 and the sacrificial material 108, plugging the release holes 116 by the plugging material 118 and finally heating the layer 202 so that the gaseous species stored in the layer 202 are released into the cavity 102.

Figure 5:
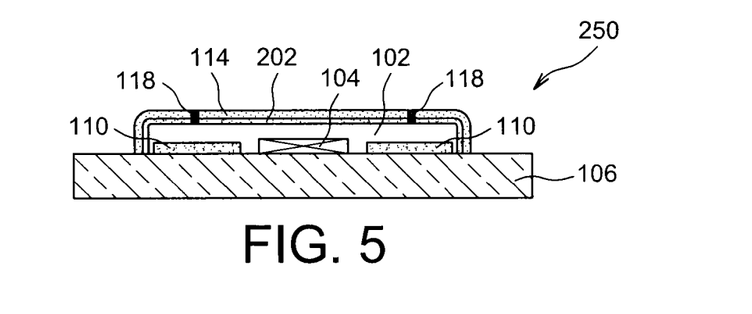

The first and second embodiments described above may be combined such that an encapsulation structure 250 thus obtained comprises portions 110 and the layer 202 in the hermetically closed cavity 102 (see FIG. 5).

In general, the material in which the gaseous species are stored may be made in any form whatsoever (portions, layers, etc.) and/or with any pattern, provided that when the cavity is closed, this material is located in the cavity or communicates with the inside of the cavity. Thus, it is possible that the material inside which the gaseous species are stored is made in a space external to the cavity 102 but communicates with the inside of the cavity when it is hermetically closed.

As a variant of the previously described embodiments, the portions 110 and/or the layer 202 may each be formed by superposition of several materials, at least one of which contains gaseous species, these materials possibly being different from each other. Such a variant is advantageously applied by making superpositions of metallic materials. Thus, the melting point of the material(s) enclosing the gaseous species can be adapted by means of eutectics formed by these different metallic materials.

In another variant, it is possible that the material(s) in the portions 110 and/or the layer 102 in which the gaseous species are stored should be thermo-degradable. These thermo-degradable materials may for example consist of organic materials such as polymers.

Thus, when this material is exposed to a temperature greater than or equal to the temperature above which it degrades, its degradation will cause the release of gaseous species into the cavity 102. After releasing the gaseous species by heating, the remaining material(s) may be partly or totally degraded.

Figures 6A, 6B:
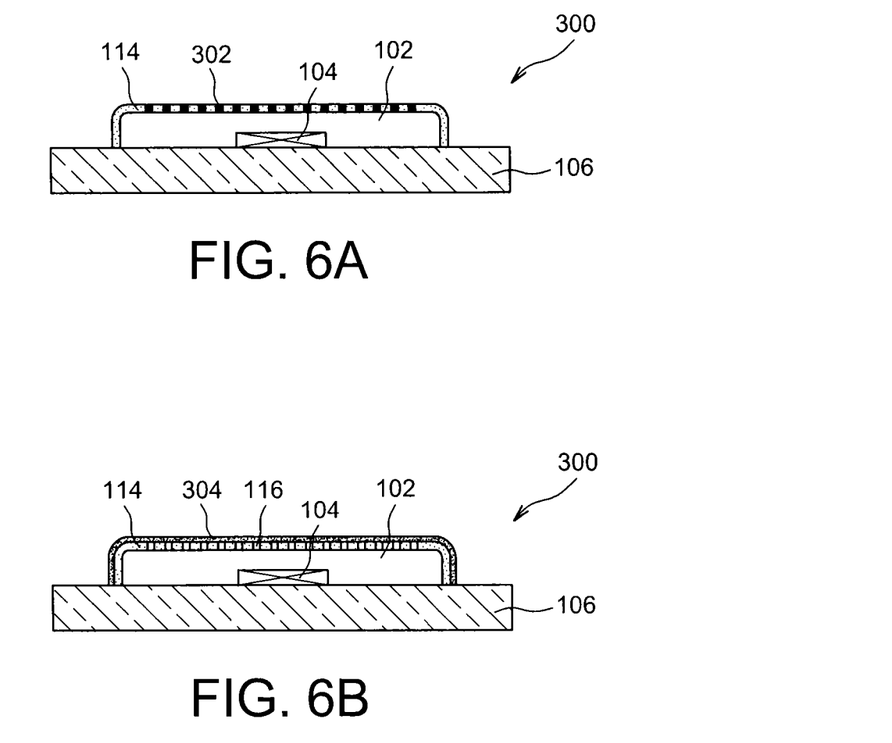

FIGS. 6A and 6B show encapsulation structures 300 obtained by the use of a production process according to two variants of a third embodiment.

Unlike the encapsulation structure 100 described above, the encapsulation structure 200 does not comprise portions of material 110 from which gaseous species escape. In this third embodiment, the gaseous species are stored in the plugging material used to close off the release holes 116 made in the form of portions 302 (or plugs) each closing off one or several of the release holes 116 (case shown in FIG. 6A) or in the form of a layer of material 304 covering the cover 114 and therefore also the release holes 116 (case shown in FIG. 6B).

Such an encapsulation structure 300 may for example be obtained firstly by making the electronic device 104 on the substrate 106, and then the sacrificial layer 112. The cover 114 is made on the sacrificial layer 112 and the release holes 116 are made through the cover 114. The sacrificial layer 112 and the sacrificial material 108 are then etched. The portions 302 or the plugging layer 304 of the release holes 116 are then made for example by PVD or PECVD deposition, thus introducing gaseous elements into these materials. This closing of the cavity 102 by portions 302 or the layer 304 is advantageously done under a vacuum or at low pressure of one or several non-precursor gases. The process is then completed in the same way as in the previous embodiments, by locally or generally heating the portions 302 or the layer 304 such that the gaseous species stored in the portions 302 or the layer 304 are partly released into the cavity 102.

The third embodiment may be combined with the first and/or second embodiment described above such that the portions 302 or the layer 304 communicate with the inside of the cavity 102 in which the portions 110 and/or the layer 202 are also located. The different variants described above in relation to the first or the second embodiment may also be applied to this third embodiment.

Figure 7:
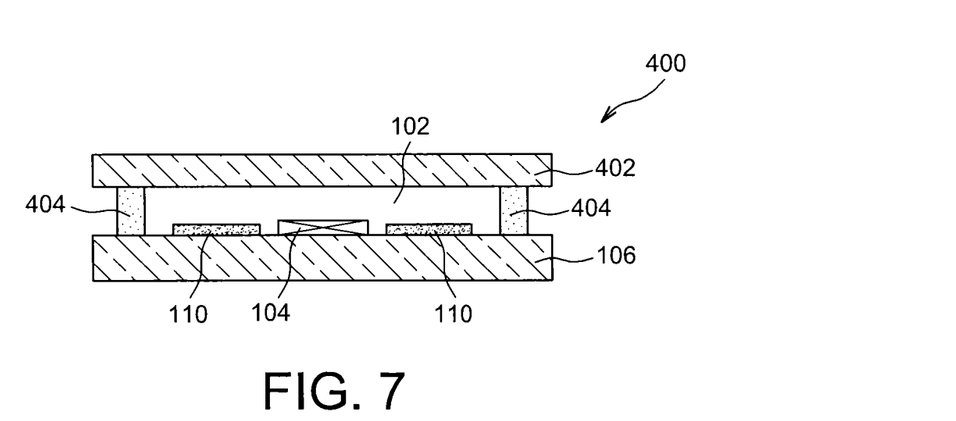

In all the embodiments described above, the encapsulation structures are obtained by use of a TLP (Thin Layer Packaging) type process. However, these different encapsulation structures can also be made by substrate transfer. In this case, the cover layer 114 is replaced by a second substrate forming the cover of the cavity 102, the side walls of the cavity 102 being formed by portions of material forming a bonding interface between the substrate 106 and the second substrate. Such an encapsulation structure 400 is shown in FIG. 7. In this example, the cavity 102 is formed between the first substrate 106 and a second substrate 402 solidarised to the first substrate 106 through portions of material 404 also forming the side walls of the cavity 102. The cavity 102 may also be formed in the second substrate 402, for example by micromachining, in this case the first substrate 106 and the second substrate 402 possibly being solidarised to each other directly. As a variant, the material in which the gaseous species are enclosed may be made in the form of portions and/or a layer for example placed in contact with the second substrate 402 and/or the side walls 404 of the cavity 102. The different variants described above may also be applied to the encapsulation structure 400.

The invention claimed is:

1. A process for making an encapsulation structure comprising at least the following steps:
    making a hermetically closed cavity having therein a first portion of material that contains at least one element trapped within said material, which is released as gas from said material when said material is heated; and
    heating all or part of said first portion of material such that at least part of the trapped element is released in gaseous form from said first portion of material in the cavity
    wherein the first material within which the element is trapped remains in the encapsulation structure after the heating.

2. The process according to claim 1, also comprising a step of placing at least one electronic device in the cavity containing said first portion of material.

3. The process according to claim 2, also comprising the following steps before said heating step:
    providing the electronic device and said first portion of material on a substrate; and
    the step of making the hermetically closed cavity,
    wherein the cavity is formed between the substrate and a cover.

4. The process according to claim 3, also comprising producing at least one layer of said material arranged in the cavity and being one of in contact with the cover and forming the cover, during the making of the hermetically closed cavity,
    wherein the heating step also heats said at least one layer of material thereby releasing at least part of the gas from said at least one layer of material in the cavity.

5. The process according to claim 2, also comprising the following steps before the heating step is applied to said first portion of material:
    providing the electronic device on a substrate; and
    the step of making the hermetically closed cavity,
    wherein the cavity is formed between the substrate and a cover, said first portion of material forming a layer of material arranged in the cavity and in contact with the cover.

6. The process according to claim 3, wherein the making of the hermetically closed cavity includes
    producing at least one hole through at least the cover such that the hole provides an access inside the cavity, and
    hermetically closing the cavity by plugging the at least one hole with a second portion of said material,
    wherein the heating step also heats said second portion of said material, thereby releasing at least part of the gas from said second portion of material in the cavity.

7. The process according to claim 3, wherein the making of the hermetically closed cavity includes
    making at least one hole through at least the cover such that the hole forms provides an access inside the cavity, and
    hermetically closing the cavity by plugging the at least one hole with at least one layer of said material covering the cover,
    wherein the heating step also heats said at least one layer of said material, releasing at least part of the gas from said at least one layer of said material in the cavity.

8. The process according to claim 2, also comprising the following steps before the step of making said hermetically closed cavity:
    providing the electronic device on a substrate,
    wherein the making of the cavity occurs at least where the electronic device is placed, the cavity being formed between the substrate and a cover, and
    wherein the making of the cavity includes producing at least one hole through at least the cover, the cavity then being hermetically closed by making said first portion of material plug the at least one hole.

9. The process according to claim 2, also comprising the following steps before the step of making said hermetically closed cavity:
    providing the electronic device on a substrate,
    wherein the making of the cavity occurs at least where the electronic device is placed, the cavity being formed between the substrate and a cover, and
    wherein the making of the cavity includes producing at least one hole through at least the cover, the cavity then being hermetically closed by making said first portion of material form of a layer covering the cover.

10. The process according to claim 1, wherein at least said first portion of said material is made by at least PVD or PECVD type deposition of said material, said deposition storing gaseous elements in said material corresponding to at least part of said at least one element trapped within said material.

11. The process according to claim 1, wherein said at least one element trapped in said first portion of material includes doping agents implanted in said material, said doping agents being released in gaseous form when said material is heated.

12. The process according to claim 1, wherein the cavity is hermetically closed under a vacuum or at low pressure of at least one gas.

13. The process according to claim 1, wherein said material is composed of at least one metal, heating of said first portion of material being done at a temperature greater than or equal to the melting point of said material.

14. The process according to claim 1, wherein the step of making said said hermetically closed cavity includes depositing said first portion of said material on a substrate including a first PVD or PECVD type deposition of a first metal and a second deposition by electrolysis or degraded electrolysis of a second metal on the first metal.

15. The process according to claim 2, further comprising:
    prior to a depositing of the first portion of the material within the hermetically closed cavity, making of the at least one electronic device with a first sacrificial layer; and
    after the depositing of the first portion of the material, encapsulating the at least one electronic device and the first portion of the material with a second sacrificial layer.

* * * * *